United States Patent
Penunuri

(10) Patent No.: US 6,424,238 B1
(45) Date of Patent: Jul. 23, 2002

(54) ACOUSTIC WAVE FILTER AND METHOD OF FORMING THE SAME

(75) Inventor: David Penunuri, Fountain Hills, AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/757,191

(22) Filed: Jan. 8, 2001

(51) Int. Cl.$^7$ .............................. H03H 9/64; H03H 9/58
(52) U.S. Cl. ..................................... 333/187; 333/193
(58) Field of Search ................................. 333/191, 187, 333/186, 188, 193, 194, 195, 196; 310/313 R, 313 B, 311

(56) References Cited

U.S. PATENT DOCUMENTS

| | | | |
|---|---|---|---|
| 5,471,178 A | * 11/1995 | Hickernell | 333/195 |
| 5,638,036 A | * 6/1997 | Penunuri et al. | 333/194 |
| 5,692,279 A | 12/1997 | Mang et al. | |
| 5,701,645 A | * 12/1997 | Allen et al. | 29/25.35 |
| 5,790,000 A | * 8/1998 | Dai et al. | 333/193 |
| 5,844,347 A | * 12/1998 | Takayama et al. | 310/313 R |
| 5,854,579 A | 12/1998 | Penunuri | |
| 5,872,493 A | 2/1999 | Ella | |
| 5,933,062 A | 8/1999 | Kommrusch | |
| 6,262,637 B1 | * 7/2001 | Bradley et al. | 333/133 |

FOREIGN PATENT DOCUMENTS

| | | | | |
|---|---|---|---|---|
| JP | 56-047116 | * | 4/1981 | H03H/9/25 |
| JP | 3-062715 | * | 3/1991 | H03H/9/02 |

OTHER PUBLICATIONS

Miskinis, R., et al., Surface Acoustic Wave Resonators on GaAs Substrates, Annual Reports 1996, Mar. 14, 1997, http://www.pfi.lt/pub/AnRep/96/5/miskin.htm.

* cited by examiner

Primary Examiner—Robert Pascal
Assistant Examiner—Dean Takaoka
(74) Attorney, Agent, or Firm—William E. Koch; Douglas W. Gilmore

(57) ABSTRACT

An acoustic wave filter (10) and a method (30) of forming the acoustic wave filter (10) are disclosed. The acoustic wave filter includes a substrate (20) supporting a first die (18) and a second die (18). The first die (18) and second die (18) include either a Surface Acoustic Wave (SAW) resonator or a Bulk Acoustic Wave (BAW) resonator, wherein one of the resonators is configured as a series resonator (12) of the acoustic wave filter (10) and the other resonator is configured as a shunt resonator (14) of the acoustic wave filter (10).

18 Claims, 3 Drawing Sheets

ACOUSTIC WAVE FILTER AND METHOD OF FORMING THE SAME

FIELD OF THE INVENTION

The present invention generally relates to filters, and more particularly to an acoustic wave filter comprised of a Surface Acoustic Wave (SAW) resonator and a Bulk Acoustic Wave (BAW) resonator and a method of forming the same.

BACKGROUND OF THE INVENTION

The communications industry has placed a great deal of emphasis upon miniaturizing communications devices such as portable phones, radios and the like. Simultaneously, the industry has increased the complexity of such devices. Therefore, filters within such devices are sought that exhibit properties such as smaller size, lighter weight, lower cost and higher performance. One example of such a filter is a radio frequency (RF) front-end filter for use in a duplexer of a small portable radio or phone.

Acoustic wave filters that are formed of all Surface Acoustic Wave (SAW) or all Bulk Acoustic Wave (BAW) resonators are typically small and lightweight and exhibit some high performance characteristics. (See U.S. Pat. No. 5,854,579, titled "Saw Filter Using Low-Pass Configuration and Method of Providing the Same," issued to David Penunuri on Dec. 29, 1998, for an example of an all SAW filter, which is hereby incorporated by reference, and U.S. Pat. No. 5,872,493, titled "Bulk Acoustic Wave Filter Having a Top Portion that Includes a Protective Acoustic Mirror," issued to Juha Ella on Feb. 16, 1999, for an example of a BAW filter, which is hereby incorporated by reference, and hereinafter referred to as the "Ella Reference"). For example, SAW filters are known to exhibit high coupling coefficients and, therefore, provide superior rejection of undesired frequencies. BAW filters, on the other hand, are known to maintain a low insertion loss and to have low temperature coefficients, which prevent drift out of the transition bands at elevated temperatures. (See U.S. Pat. No. 5,933,062, titled "Acoustic Wave Ladder with Effectively Increased Coupling Coefficient and Method of Providing the Same," issued to Richard S. Kommrusch on Aug. 3, 1999, for additional discussion of filter properties, which is hereby incorporated by reference.)

While acoustic wave filters that are formed of all SAW or all BAW resonators are typically small, light weight, and exhibit some high performance characteristics, these all SAW or all BAW resonator filters suffer from performance weaknesses. For example, a SAW filter may suffer from high insertion loss or excessive drift out of the transition band due to high temperature coefficients. BAW filters, on the other hand, may suffer from low coupling coefficients, resulting in poor rejection of undesired frequencies.

Accordingly, it is desirable to provide an acoustic wave filter that combines SAW and BAW resonators to form a filter that takes advantage of the respective strengths of the two different resonators and minimizes the weaknesses. Furthermore, it is desirable to provide an efficient method for forming such a filter. Additionally, other desirable characteristics will become apparent to one skilled in the art from the foregoing background of the invention, the following detailed description of the drawings and the appended claims.

BRIEF DESCRIPTION OF THE DRAWINGS

The present invention will hereinafter be described in conjunction with the appended Figures, wherein.

DETAILED DESCRIPTION OF THE DRAWINGS

The following detailed description of the drawings is merely exemplary in nature and is not intended to limit the invention or the application and uses of the invention.

The present invention provides an acoustic wave filter having at least one Surface Acoustic Wave (SAW) resonator as either a shunt or a series resonator and at least one Bulk Acoustic Wave (BAW) resonator as a shunt or series resonator. Advantageously, a filter according to the present invention exhibits desirable properties of both the SAW and the BAW resonators. Furthermore, the filter is formed according to a method that produces a high performance filter for a variety of applications at relatively low cost.

Figure 1:
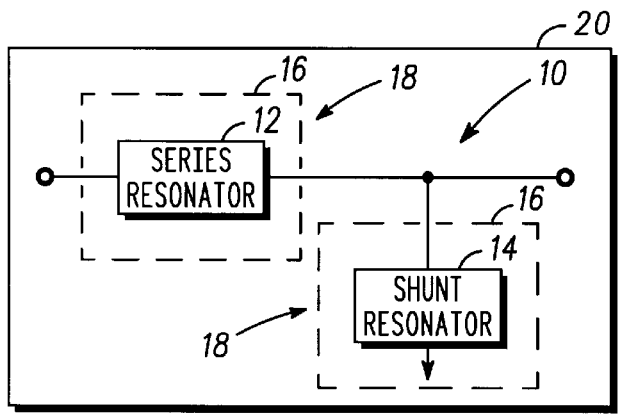
FIG. 1 illustrates a ladder resonator filter according to one aspect of the present invention.

Referring to FIG. 1, there is illustrated a plan view of an acoustic wave resonator filter 10 according to one non-limiting aspect of the present invention. The filter 10 is a ladder network that includes a series resonator 12 and a shunt resonator 14. The series resonator 12 and the shunt resonator 14 are preferably disposed upon individual substrates 16 (e.g., piezoelectric substrates) to form a pair of dies 18, and each of the dies 18 is preferably disposed upon another substrate 20 (e.g., a ceramic substrate such as alumina). At least one of the resonators (12,14) is a SAW (e.g., a rayleigh wave, a surface skimming bulk acoustic wave, a leaky wave or the like) resonator and at least one of the resonators (12,14) is a BAW (e.g., a crystal, thin film acoustic, film bulk acoustic or the like) resonator.

Figure 2:
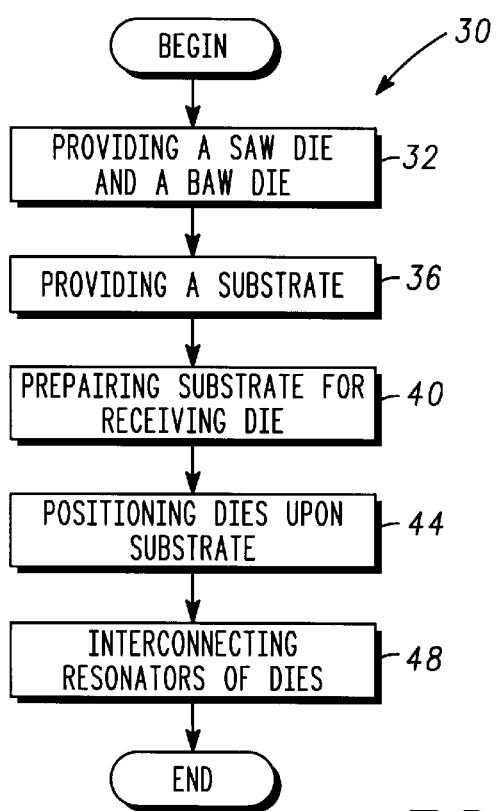
FIG. 2 illustrates a block diagram of a process for forming a filter according to an aspect of the present invention.

Referring to FIG. 2, there is illustrated a method 30 with steps 32–48 for forming a filter, such as the filter 10 of FIG. 1. Initially a SAW die and a BAW die are provided as indicated at the first block 32. The SAW die includes at least one SAW resonator, but can include multiple SAW PATENT resonators. In one embodiment, the SAW die is a single crystal wafer having one or more SAW resonators constructed thereon. Thus, the SAW die can be one or more thin metallic patterns of interdigitated electrodes conventionally supported by a wafer, which can be fabricated from a variety of suitable materials such as ST-cut quartz, forty one degree (41°) rotated Y-cut X-propagating lithium niobate (LiNbO$_3$), sixty four degree (64°) rotated Y-cut X-propagating LiNbO$_3$, thirty six degree (36°) rotated Y-cut X-propagating (lithium tantalate) LiTaO$_3$, and forty five degree (45°) rotated X-cut Z-propagating lithium tetraborate (Li$_2$B$_4$O$_7$). Preferably, the resonators are constructed on the thirty six degree (36°) rotated Y-cut X-propagating LiTaO$_3$.

The BAW die includes at least one BAW resonator, but can include multiple BAW resonators. In one embodiment, the BAW resonators can include three basic portions. A first one of the portions, which is used to generate acoustic waves, includes an acoustically-active piezoelectric layer. This layer can comprise, by example, zinc-oxide (ZnO), aluminum nitride (AlN), zinc-sulfide (ZnS), or any other suitable piezoelectric material that can be fabricated as a thin film. Preferably, the BAW resonators are constructed of aluminum (AlN). A second one of the portions includes electrodes that are formed on opposite sides of the piezoelectric layer forming a parallel plate capacitor. A third portion of the BAW resonator preferably includes a mechanism for acoustically isolating the substrate from vibrations produced by the piezoelectric layer. BAW resonators are typically fabricated on silicon, gallium arsenide, sapphire or glass substrates using thin film technology (e.g., sputtering, chemical vapor deposition, etc.). (See Ella reference for an example of a fabricated BAW). In an alternative embodiment and according to known technology, the BAW resonator may be formed as a suspended membrane by etching silicon away from aluminum nitride layers to expose and/or isolate electrodes applied to the sides of the layers. BAW resonators exhibit series and parallel resonances that are similar to those of, by example, crystal resonators. As an example, for mobile phone applications, resonant frequencies of BAW resonators can typically range from about 0.5 GHz to 5 GHz, depending on the layer thicknesses of the devices. However, any frequency range can be used in accordance with the present invention.

Once the desired SAW and BAW dies have been supplied, a substrate for supporting the dies is provided according to a second block 36 of the method 30. The substrate may be chosen from materials such as ceramic materials, organic printed circuit boards, glass substrates or the like. In one embodiment of the invention, the substrate includes one or more layers of ceramic material suitable for use in a multilayer ceramic package. Ceramic layers may be chosen from materials having mica, quartz, alumina, aluminum nitride, metal oxide, metal nitride, metal boride, metal carbide or the like. Preferably, one or more glass loaded alumina layers are utilized as the substrate.

Once the substrate for supporting the dies is provided, the substrate may be prepared for receiving the dies as illustrated by the third block 40. In one embodiment, the substrate is formed to include cavities suitable for receiving the SAW and BAW dies. For example, the substrate may be one or more layers of ceramic material (e.g., green tape) in the green state and the cavities can be formed by ablating, drilling, punching, etching, chemical removal techniques or other suitable material removal techniques.

Figure 3:
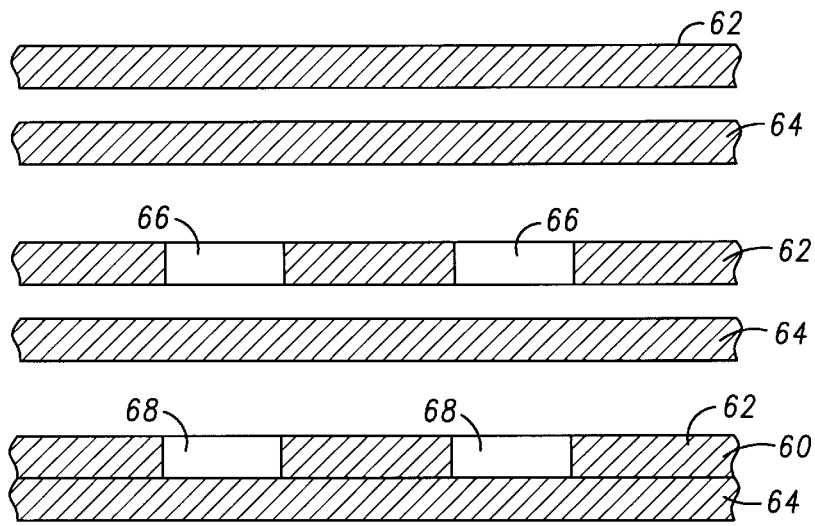
FIG. 3 illustrates a sequence for processing layers for a multilayer ceramic package so that the layers form a pair of cavities according to an aspect of the present invention.

In one preferred embodiment, and referring to FIG. 3, the substrate 60 for receiving the dies include a first alumina layer 62 and a second alumina layer 64 suitable for use in an multilayer ceramic MLC package. The first layer 62 is conventionally punched with one or more through holes 66 while in the green state. Thereafter, the first layer 62 is conventionally laminated to one side of the second layer 64, thereby restricting access to the through holes 66 from the one side of the first layer 62, thus forming the through-holes 66 into the cavities 68 within the substrate 60. Thereafter, the substrate 60 may be co-fired and otherwise conventionally processed as with conventional MLC packages.

After the substrate 60 is prepared to receive the SAW and BAW dies, the dies are positioned at least partially upon or at least partially within the substrate 60 as indicated by the fourth block 44 in FIG. 2. In the preferred embodiment, the dies are physically placed within the cavities 68 formed in the substrate 60 and secured therein. The dies may be secured within the cavities 68 in a variety of manners. For example, a thermoplastic resin may be heated within the cavity until tacky and the SAW and BAW dies may be placed within the cavities such that the thermoplastic cools and hardens, thereby securing the die in the cavity. In another example, an epoxy may be contacted with the die and a portion of the substrate 60 within the cavity such that the epoxy cures, thereby securing the die in the cavity.

As indicated by the fifth block 48 in FIG. 2, the resonators of the dies are electrically coupled to each other to form a ladder filter such as the filter 10 of FIG. 1 with at least one SAW resonator in series or shunt and at least one BAW resonator in series or shunt. A variety of methods may be used to electrically couple the resonators. In a preferred embodiment, the substrate 60 of FIG. 3 is used for making a filter and one or more metallic interconnects (e.g. thin or thick film traces) (not shown) are patterned upon the second alumina layer 64 such that bond pads, wire bonds, flip chip technology can electrically connect the resonators in the cavities 68 to the metallic interconnects.

As shall be appreciated, varying quantities and types of SAW and BAW resonators can be placed in series or in shunt as needed or desired and corresponding dies having those quantities of either SAW or BAW resonators can be created in accordance with the present invention. Furthermore, cavities of varying sizes and shapes can be formed in ceramic substrates to accommodate dies of variable sizes and shapes.

Figure 4:
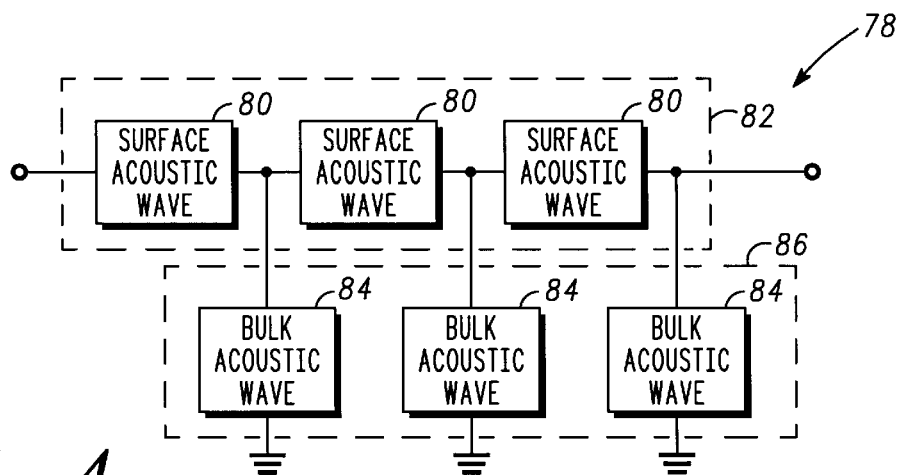
FIG. 4 illustrates a SAW/BAW filter according to an aspect of the present invention.
Figure 5:
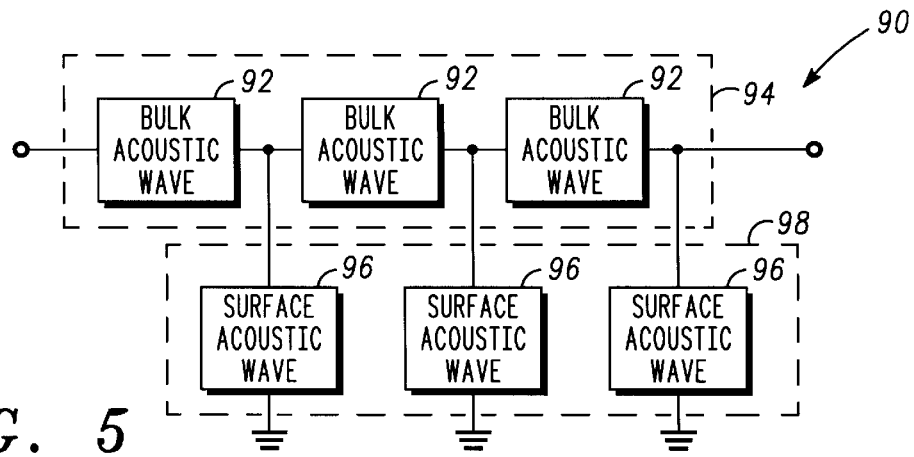
FIG. 5 illustrates another SAW/BAW filter according to an aspect of the present invention.
Figure 6:
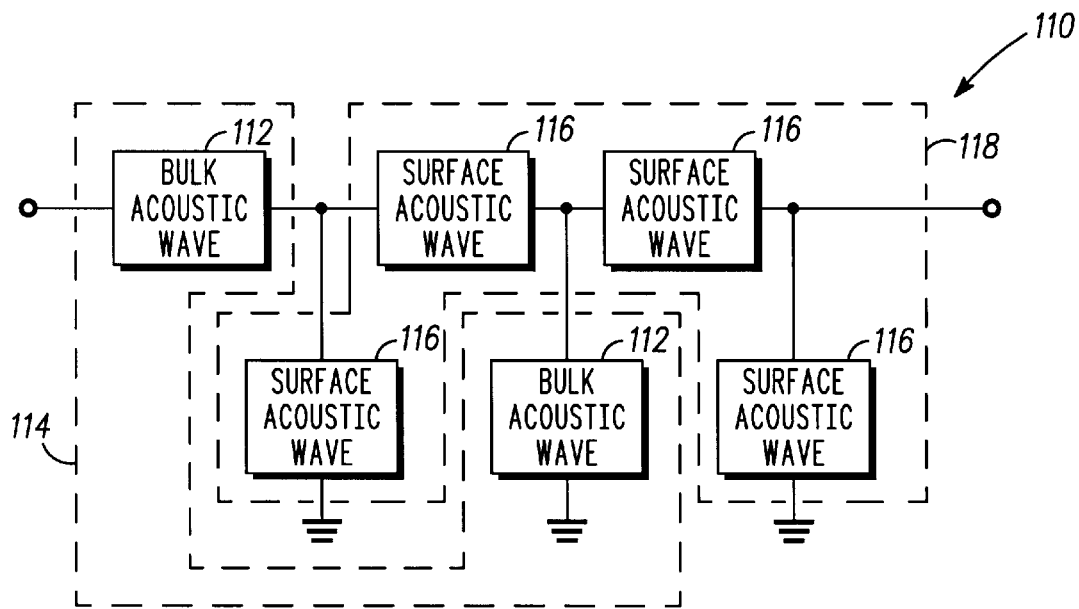
FIG. 6 illustrates still another SAW/BAW filter according to an aspect of the present invention.

The number of resonators selected for either a SAW or a BAW die can depend upon the desired characteristics or required specifications of the particular filter that is needed for a particular application. Referring to FIGS. 4, 5 and 6, examples of different combinations of SAW and BAW dies are illustrated that are used to form ladder filters. In FIG. 4, there is a SAW/BAW ladder filter 78 that includes three SAW resonators 80 in series supported and/or disposed on a single SAW die 82 and three BAW resonators 84 in shunt supported and/or disposed on a single BAW die 86. In FIG. 5, there is a SAW/BAW ladder filter 90 that includes three BAW resonators 92 in series supported and/or disposed on a single BAW die 94 and three SAW resonators 96 in shunt supported and/or disposed on a single SAW die 98. In FIG. 6, there is a SAW/BAW ladder filter 110 that includes two BAW resonators 112, one in series, one in shunt supported and/or disposed on a single BAW die 114 and four SAW resonators 116, two in series, two in shunt supported and/or disposed on a single SAW die 118. The skilled artisan shall appreciate that numerous other configurations and combinations of SAW and BAW dies are possible within the scope of the present invention.

Computer simulations can be utilized to select the quantity and manner in which SAW and BAW resonators should be combined to form a filter. A simulation program, such as a circuit or filter simulation program, can be executed with the desired properties of a ladder resonator filter provided as input parameters. One such program is called Advanced Design System (ADS) and is commercially available from Agilent Technologies, 395 Page Mill Road, Palo Alto, Calif. However, any number of simulation programs can be used in accordance with the present invention. The simulation program produces a ladder filter with resonators in a ladder configuration with the desired characteristics specified by the input parameters. Thereafter, these idealized resonators may be replaced with computer simulated SAW or BAW resonators having the performance characteristics most nearly similar to the idealized resonators. Once the desired configurations or placements of SAW and BAW resonators within a particular filter are established, SAW and BAW dies having those resonators may be formed and combined as previously described. Advantageously, in this manner, SAW and BAW resonators may be combined to form a filter that takes advantage of the needed or desired properties of the SAW and the BAW resonators while minimizing the undesirable properties of those resonators.

Although various embodiments of this invention have been shown and described, it shall be understood that variations, modifications and substitutions, as well as rearrangements and combinations of the preceding embodiments can be made by those skilled in the art without departing from the spirit and scope of this invention.

What is claimed is:

1. An acoustic wave filter comprising:
    a substrate;
    a first die supported by said substrate, said first die having a first Surface Acoustic Wave resonator configured as a series resonator of said acoustic wave filter;
    a second die supported by said substrate, said second die having a first Bulk Acoustic Wave resonator electrically coupled to said first Surface Acoustic Wave resonator and configured as a shunt resonator of said acoustic wave filter.

2. An acoustic wave filter as in claim 1, wherein said substrate is configured with cavities for receiving said first and second dies.

3. An acoustic wave filter as in claim 2, wherein said substrate is formed of a ceramic material.

4. An acoustic wave filter as in claim 2, wherein said substrate includes at least two ceramic layers.

5. An acoustic wave filter as in claim 1, wherein said first die has a second SAW resonator electrically coupled in a configuration selected from the group consisting of shunt and series resonators.

6. An acoustic wave filter as in claim 1, wherein said second die has a second BAW resonator electrically coupled in a configuration selected from the group consisting of shunt and series resonators.

7. An acoustic wave filter comprising:
    a substrate;
    a first die supported by said substrate, said first die having a first Bulk Acoustic Wave resonator configured as a series resonator of said acoustic wave filter;
    a second die supported by said substrate, said second die having a first Surface Acoustic Wave resonator electrically coupled to said first Bulk Acoustic Wave resonator and configured as a shunt resonator of said acoustic wave filter.

8. An acoustic wave filter as in claim 7, wherein said substrate is configured with cavities for receiving said first and second dies.

9. An acoustic wave filter as in claim 8, wherein said substrate is formed of a ceramic material.

10. An acoustic wave filter as in claim 8, wherein said substrate includes at least two ceramic layers.

11. An acoustic wave filter as in claim 7, wherein said second die has a second SAW resonator electrically coupled to said first SAW resonator in a configuration selected from the group consisting of shunt and series resonators.

12. An acoustic wave filter as in claim 7, wherein said first die has a second BAW resonator electrically coupled to said first BAW resonator in a configuration selected from the group consisting of shunt and series resonators.

13. A method of forming an acoustic wave filter, said method comprising:
    providing a substrate;
    connecting a first die to said substrate, said first die having at least one Surface Acoustic Wave resonator configured as a series resonator of said acoustic wave filter;
    connecting a second die to said substrate, said second die having at least one Bulk Acoustic Wave Resonator configured as a shunt resonator of said acoustic wave filter;
    electrically coupling said at least one bulk acoustic wave resonator to said at least one surface acoustic wave resonator to form said acoustic wave filter.

14. A method as in claim 13, wherein said substrate is ceramic.

15. A method as in claim 13, wherein providing a substrate comprises:
    providing a first ceramic layer and a second ceramic layer;
    forming holes in said first ceramic layer; and
    attaching said first layer to said second layer, thereby forming the holes into cavities for receiving said first and second dies.

16. A method of forming an acoustic wave filter, said method comprising:
    providing a substrate;
    connecting a first die to said substrate, said first die having at least one Surface Acoustic Wave resonator configured as a shunt resonator of said acoustic wave filter;
    connecting a second die to said substrate, said second die having at least one Bulk Acoustic Wave Resonator configured as a series resonator of said acoustic wave filter;
    electrically coupling said at least one bulk acoustic wave resonator to said at least one surface acoustic wave resonator to form said acoustic wave filter.

17. A method as in claim 16, wherein said substrate is ceramic.

18. A method as in claim 16, wherein providing a substrate comprises:
    providing a first ceramic layer and a second ceramic layer;
    forming holes in said first ceramic layer; and
    attaching said first layer to said second layer thereby forming the holes into cavities for receiving said first and second dies.

* * * * *